United States Patent
Nomoto et al.

(10) Patent No.: US 7,615,986 B2
(45) Date of Patent: Nov. 10, 2009

(54) TEMPERATURE DETECTION FUNCTION-INCORPORATING CURRENT SENSOR

(75) Inventors: Shingo Nomoto, Shimada (JP); Shinichi Tamura, Shimada (JP)

(73) Assignee: Yazaki Corporation, Tokyo (JP)

( * ) Notice: Subject to any disclaimer, the term of this patent is extended or adjusted under 35 U.S.C. 154(b) by 10 days.

(21) Appl. No.: 11/723,627

(22) Filed: Mar. 21, 2007

(65) Prior Publication Data
US 2007/0257659 A1    Nov. 8, 2007

(30) Foreign Application Priority Data
Apr. 10, 2006    (JP) .............................. 2006-107640

(51) Int. Cl.
*G01R 15/20* (2006.01)
(52) U.S. Cl. .................................................. 324/117 H
(58) Field of Classification Search ............. 324/117 R, 324/117 H; 338/32 H
See application file for complete search history.

(56) References Cited

U.S. PATENT DOCUMENTS

| | | | | |
|---|---|---|---|---|
| 2,814,015 A | * | 11/1957 | Kuhrt | 323/368 |
| 3,825,777 A | * | 7/1974 | Braun | 327/511 |
| 4,682,101 A | * | 7/1987 | Cattaneo | 324/117 H |
| 4,939,448 A | * | 7/1990 | Gudel | 324/117 R |
| 5,604,433 A | * | 2/1997 | Theus et al. | 324/251 |
| 5,615,075 A | * | 3/1997 | Kim | 361/87 |
| 2002/0011841 A1 | * | 1/2002 | Goto et al. | 324/251 |
| 2004/0080333 A1 | * | 4/2004 | Klein | 324/772 |
| 2004/0138836 A1 | * | 7/2004 | Ishishita et al. | 702/63 |

FOREIGN PATENT DOCUMENTS

| | | | |
|---|---|---|---|
| JP | 2001-272422 A | | 10/2001 |
| JP | 2003-209935 A | | 7/2003 |
| JP | 2004-254491 A | | 9/2004 |
| JP | 2006-003209 | * | 1/2006 |
| JP | 2006-046576 A | | 2/2006 |

* cited by examiner

*Primary Examiner*—Ha Tran T Nguyen
*Assistant Examiner*—Karen M Kusumakar
(74) *Attorney, Agent, or Firm*—Sughrue Mion, PLLC

(57) ABSTRACT

A temperature detection function-incorporating current sensor includes a Hall IC, connector terminals for respectively outputting signals, detected by the Hall IC, to the exterior. The Hall IC includes a magnetism detection portion for detecting a magnitude of a magnetic field, a temperature detection portion for detecting an ambient temperature, and a temperature compensation portion for correcting an error of the magnetism detection portion due to temperature dependency based on the temperature detected by the temperature detection portion. The detection signal of the magnetism detection portion, corrected with respect to the error, and the temperature signal detected by the temperature detection portion are outputted via the connector terminals to the exterior. In this current sensor, it is not necessary to provide an additional temperature detection part, and also it is not necessary to effect an operation for connecting such a part to a board. Therefore, the product can be formed into a compact design and a low-cost design, and can be easily assembled.

4 Claims, 6 Drawing Sheets

TEMPERATURE DETECTION FUNCTION-INCORPORATING CURRENT SENSOR

BACKGROUND OF THE INVENTION

1. Field of the Invention

This invention relates to a current sensor for detecting an electric current by utilizing a Hall effect, and more particularly to a current sensor having a temperature detection function.

2. Related Art

Hall elements for outputting a voltage corresponding to the magnitude of a magnetic field have heretofore been extensively used in current sensors, and in such a current sensor, the amount of current is detected from the magnitude of the magnetic field generated in proportion to the current.

In automobiles, a current detection is effected by the use of a current sensor, for example, in order to monitor the charging/discharging of a battery or to control a drive motor.

In automobiles, the temperature of a battery, a motor or others is measured, and an ECU controls such a device into an optimum condition based on the measured value (see JP-A-2004-254491, JP-A-2003-209935 and JP-A-2006-46576).

JP-A-2001-272422 discloses a current detection apparatus for a vehicle in which a current path for a temperature detection element is formed utilizing a board of a current sensor on which a Hall element is mounted. As shown in FIG. 8, this apparatus includes the current sensor 12 supported on a bus bar 14 connected to a terminal 17 of a battery 13, and the temperature detection element 20 retained by the bus bar 14.

The current sensor 12 comprises a core 32 of a C-shape (i.e., an O-shape part of which is removed or notched to form a gap), the Hall element 33 disposed in the gap of the core 32, the board 31 on which the Hall element 33 is mounted, and a case 29 housing these parts. The core 32 collects magnetic flux from an electric current flowing through the bus bar 14, to a connector 18 and a cable 16, and forms parallel flux (which is proportional to the magnitude of the current) in the gap. The Hall element 33 converts the magnitude of this magnetic flux into voltage. A connection wire 15 of the temperature detection element 20 is connected to the board 31 of the current sensor 12.

In this apparatus, the current sensor 12 and the temperature detection element 20 can have a common minus-side current path on the board 31, so that the construction of the circuit is simplified.

However, in the temperature detection function-incorporating current sensor disclosed in JP-A-2001-272422 Publication, it is necessary to additionally provide the temperature detection element 20 for the purpose of detecting the temperature, and besides an operation for connecting this temperature detection element 20 to the board 31 is required. Therefore, the apparatus increases in size, and the time and labor required for the production creases, so that the cost also increases.

SUMMARY OF THE INVENTION

This invention has been made in view of the above circumstances, and an object of the invention is to provide a temperature detection function-incorporating current sensor which has a compact design, and can be easily assembled.

The above object has been achieved by a temperature detection function-incorporating current sensor of the present invention characterized in that the current sensor comprises:
 a Hall IC; and
 connector terminals for outputting signals, detected by the Hall IC, to the exterior; and
 the Hall IC includes:
 a magnetism detection portion for detecting a magnitude of a magnetic field;
 a temperature detection portion for detecting an ambient temperature; and
 a temperature compensation portion for correcting an error of the magnetism detection portion due to temperature dependency based on the temperature detected by the temperature detection portion; and
 the detection signal of the magnetism detection portion, corrected with respect to the error, and the temperature signal detected by the temperature detection portion are outputted via the connector terminals to the exterior.

The temperature detection function-incorporating current sensor of this construction is so constructed as to output the temperature, detected by the temperature detection portion of the Hall IC, to the exterior, and therefore it is not necessary to provide an additional temperature detection part, and also it is not necessary to effect an operation for connecting such a part to a board.

In one preferred form, this temperature detection function-incorporating current sensor can be formed into the bus bar integrated-type in which the Hall IC is disposed in a gap of a core, and a bus bar passing through a central portion of the core is integrally connected with the current sensor.

In another preferred form, this temperature detection function-incorporating current sensor can be formed into the through hole type in which the Hall IC is disposed in a gap in a core, and the current sensor has a through hole passing through a central portion of the core.

In a further preferred form, this temperature detection function-incorporating current sensor can be formed into the coreless type in which a magnitude of a magnetic filed which is not collected by a core is detected.

In the temperature detection function-incorporating current sensor of the present invention, it is not necessary to provide an additional temperature detection part, and also it is not necessary to effect an operation for connecting such a part to the board, and therefore the product can be formed into a compact design and a low-cost design, and besides the current sensor can be easily assembled.

The present invention has been briefly described above. Details of the invention will become more manifest upon reading the following Section "DETAILED DESCRIPTION OF THE PREFERRED EMBODIMENTS" with reference to the accompanying drawings.

DETAILED DESCRIPTION OF THE PREFERRED EMBODIMENTS

Preferred embodiments of the present invention will now be described in detail with reference to FIGS. 1 to 7.

Figure 1:
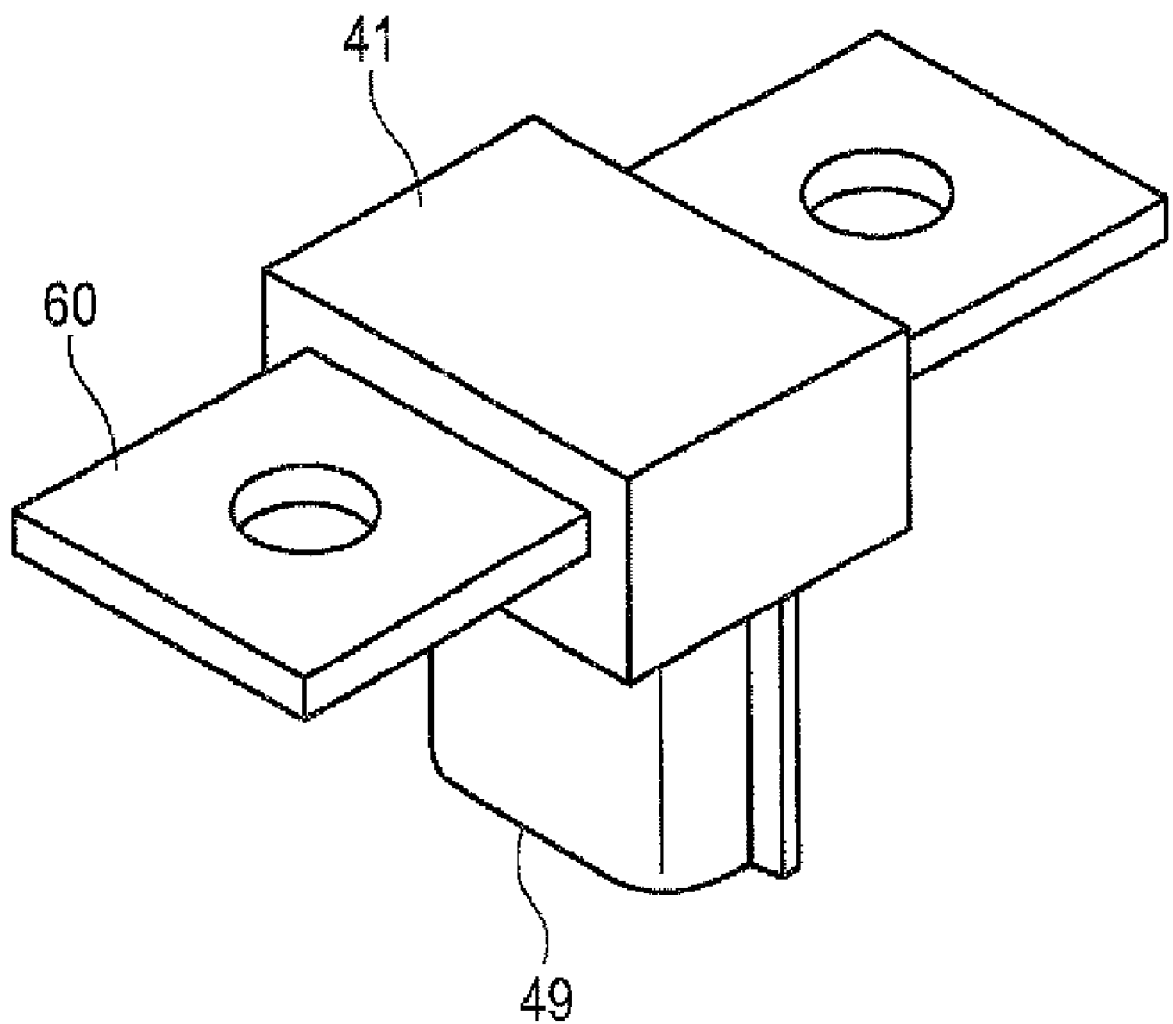
FIG. 1 is a view showing the appearance of a bus bar integrated-type temperature detection function-incorporating current sensor provided in accordance with a preferred embodiment of the invention.
Figure 2:
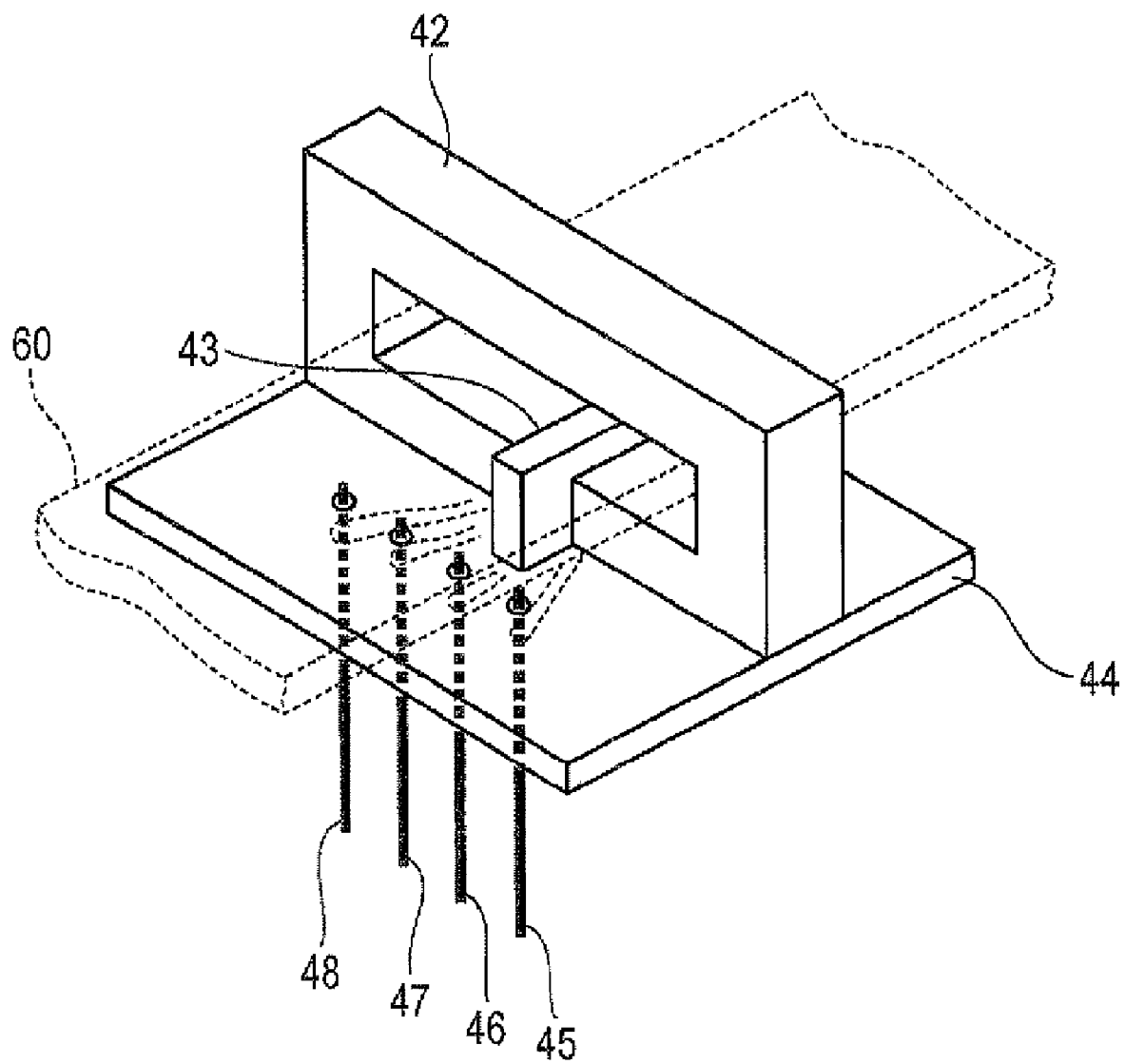
FIG. 2 is a view showing the internal structure of the temperature detection function-incorporating current sensor of FIG. 1.
Figure 3:
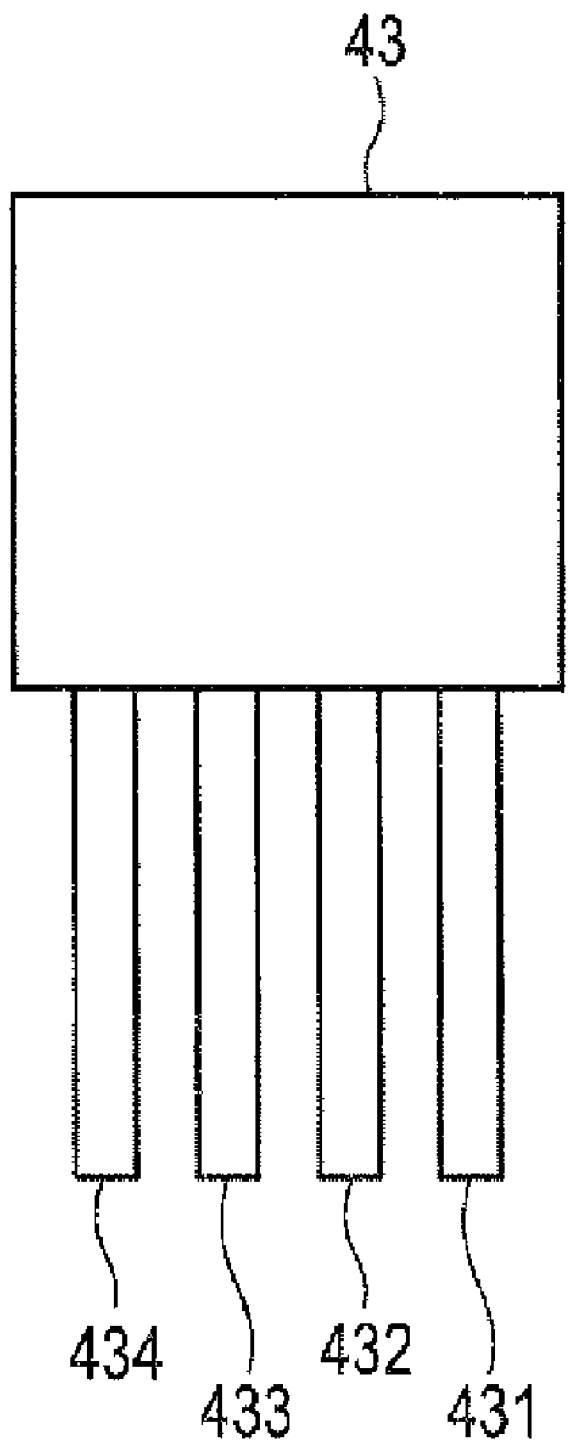
FIG. 3 is a view showing the appearance of a Hall IC used in the temperature detection function-incorporating current sensor of the invention.
Figure 4:
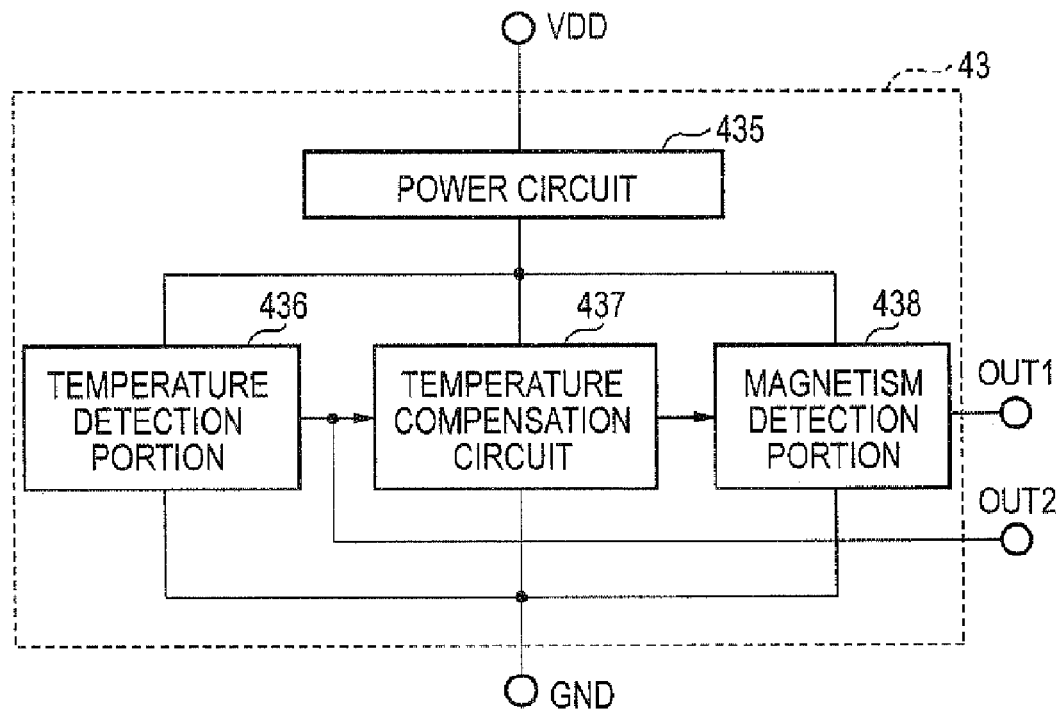
FIG. 4 is a block diagram showing the internal structure of the Hall IC of FIG. 3.

FIG. 1 is a view showing the appearance of a bus bar integrated-type temperature detection function-incorporating current sensor embodying the invention, and FIG. 2 is a view showing the internal structure of the current sensor. FIG. 3 is a view showing the appearance of a Hall IC used in the temperature detection function-incorporating current sensor, and FIG. 4 is a block diagram showing the internal structure of the Hall IC.

This current sensor comprises a current sensor body 41, a connector portion 49, and a bus bar 60. The bus bar 60 extends through the current sensor body 41, and is integrally connected with the current sensor by a case of the current sensor body 41.

As shown in FIG. 2, the current sensor body 41 contains therein a core 42, the Hall IC 43 disposed in a gap of the core 42, and a board 44 supporting the core 42 and the Hall IC 43.

Connector terminals 45, 46, 47 and 48 are formed on the board 44 in such a manner that their one end portions are buried in the board 44. These connector terminals 45, 46, 47 and 48 are connected respectively to four terminals 431, 432, 433 and 434 (FIG. 3) of the Hall IC 43 via wiring formed on the board 44. Distal ends of the connector terminals 45, 46, 47 and 48 are disposed within the connector portion 49.

As shown in FIG. 4, the Hall IC 43 includes, within a common chip, a magnetism detection portion 438 for detecting magnetism, a temperature detection portion 436 for detecting a temperature, a temperature compensation circuit 437 for correcting an error of the magnetism detection potion 438 due to temperature dependency, and a power circuit 435 for supplying electric power to the magnetism detection portion 438, the temperature detection portion 436 and the temperature compensation circuit 437.

Using two out of the four terminals 431, 432, 433 and 434, a magnetism signal detected by the magnetism detection portion 438 and a temperature signal detected by the temperature detection portion 436 are outputted respectively as at OUT1 and OUT2. Also, using another one terminal, a VDD input is applied to the power circuit 435, and using the remaining terminal, the magnetism detection portion 438, the temperature detection portion 436 and the temperature compensation circuit 437 are connected to the ground (GND).

A Hall IC itself which has a temperature detection portion and a temperature compensation circuit is already known, for example, from JP-A-2006-3209. However, in such a conventional Hall IC, a temperature detected by the temperature detection portion is used only for the purpose of correcting an error of magnetism detection due to temperature dependency, and in contrast with the present invention, the detected temperature is not outputted to the exterior of the Hall IC.

When using the temperature detection function-incorporating current sensor of this embodiment, the bus bar 60 is connected, for example, between a battery terminal and a wire harness to which electric power is supplied from a battery, and the connector portion 49 is connected to an ECU.

When an electric current flows through the bus bar 60, the core 42 collects magnetic flux generated from this current, and forms parallel magnetic flux (which is proportional to the magnitude of the current) in the gap. The magnetism detection portion 438 of the Hall IC 43 disposed in the gap detects the magnitude of this magnetic flux.

The temperature detection portion 436 of the Hall IC 43 detects a temperature of the vicinity of the Hall IC 43, and outputs a signal representative of the detected temperature to the temperature compensation circuit 437, and also outputs this signal to the exterior of the Hall IC 43 as at OUT 2.

The temperature compensation circuit 437 corrects an error of the magnetism detection portion 438 due to temperature dependency, using the temperature signal inputted thereto from the temperature detection portion 436. The magnetism detection portion 438 outputs a magnetism detection signal corrected with respect to this error as at OUT 1.

The magnetism signal output (OUT 1) outputted from the Hall IC 43 and the temperature signal output (OUT 2) are fed to the ECU via the connector portion 49, and the ECU controls the charging/discharging of the battery into an optimum condition on the basis of these signals.

Thus, this temperature detection function-incorporating current sensor outputs the temperature, detected by the temperature detection portion 436 of the Hall IC 43, to the exterior, and therefore it is not necessary to provide an additional temperature detection part, and also it is not necessary to effect an operation for connecting such a part to the board.

This temperature detection function-incorporating current sensor is located in the vicinity of a device to be controlled, and the amount of a current flowing into and out of this device and the temperature are detected, and by using these data, this device can be controlled into an optimum condition.

The present invention is not limited to the above embodiment, and suitable modifications, improvements, etc., can be made. Furthermore, the material, form, number, disposition, etc., of each of the constituent elements of the above embodiment are arbitrary, and are not limited in so far as the invention can be achieved.

Figure 5:
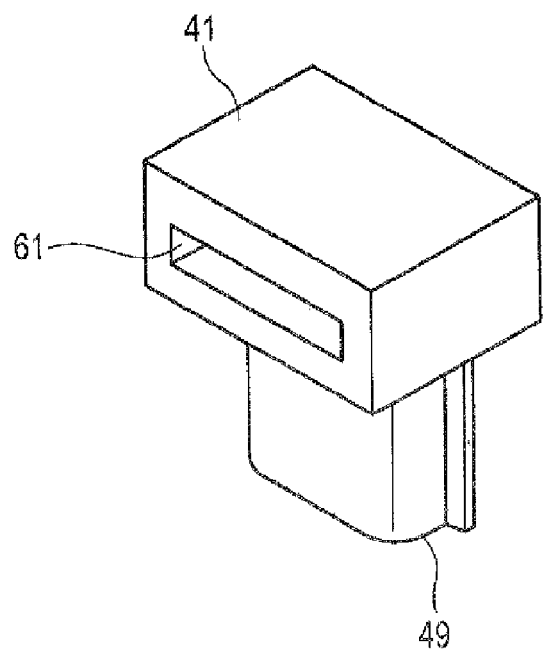
FIG. 5 is a view showing the appearance of a through hole-type temperature detection function-incorporating current sensor provided in accordance with another embodiment of the invention.
Figure 6:
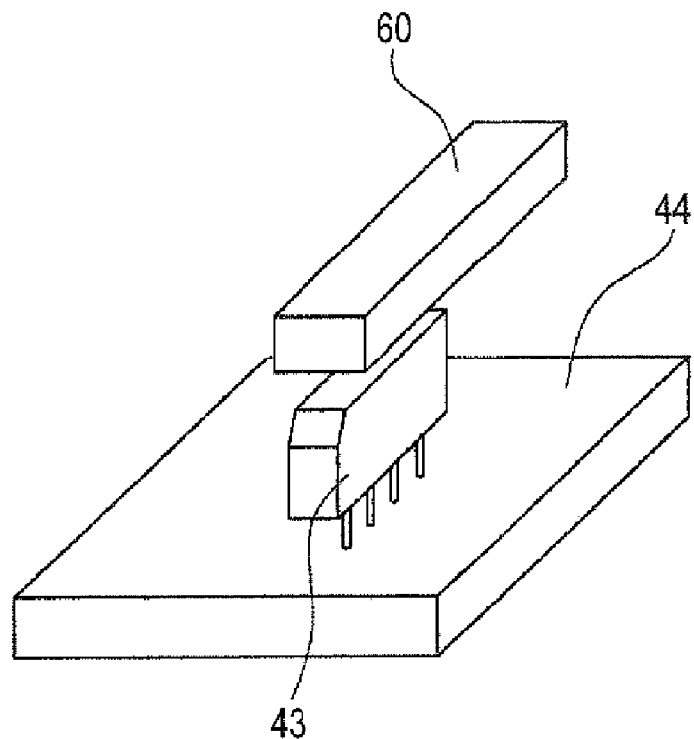
FIG. 6 is a view showing the appearance of a coreless type temperature detection function-incorporating current sensor provided in accordance with a further embodiment of the invention.
Figure 7:
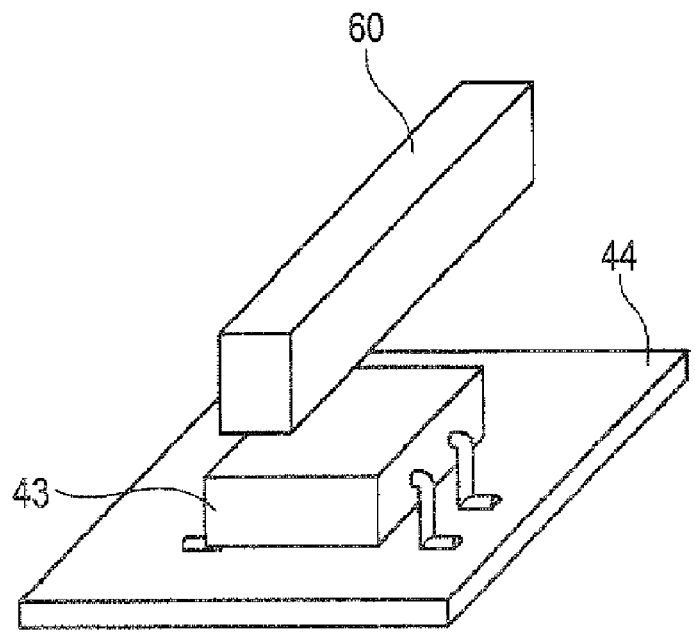
FIG. 7 is a view showing the appearance of a coreless type temperature detection function-incorporating current sensor provided in accordance with a still further embodiment of the invention.
Figure 8:
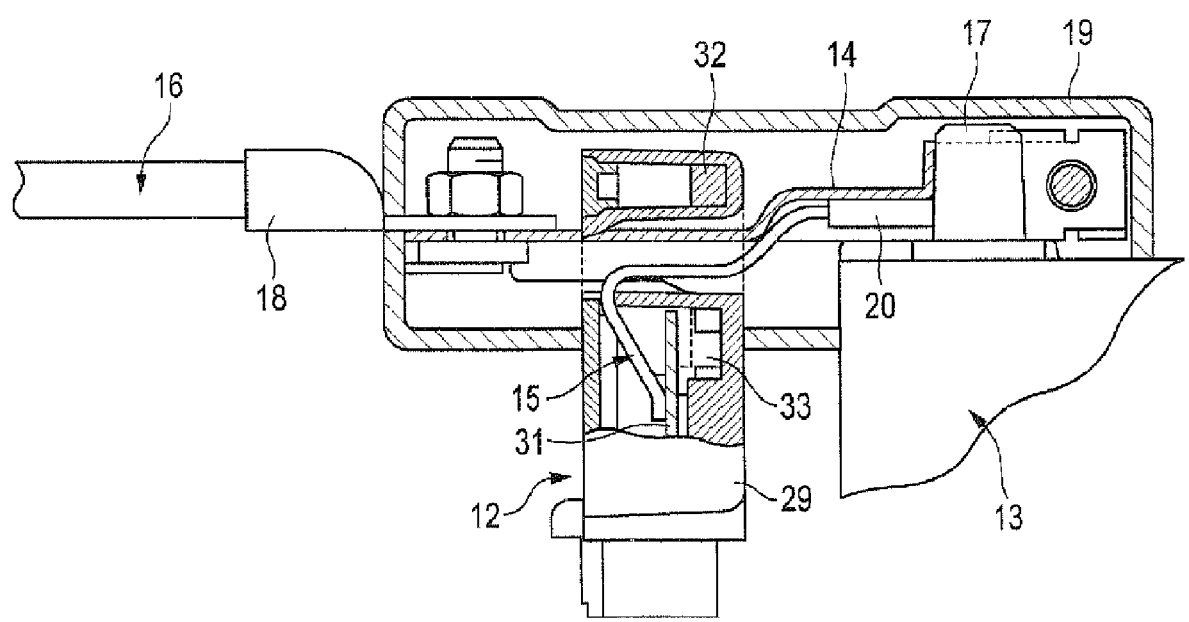
FIG. 8 is a view showing a conventional temperature detection function-incorporating current sensor.

In the above embodiment, although the bus bar integrated-type current sensor is illustrated, the invention can be applied to a current sensor of the through hole-type having a through hole 61 as shown in FIG. 5 and also to coreless type current sensors using no core as shown in FIGS. 6 and 7.

What is claimed is:

1. A temperature detection function-incorporating current sensor comprising:
    a Hall integrated circuit (IC); and
    connector terminals for outputting signals, detected by said Hall IC, to the exterior;
    wherein said Hall IC includes:
    a magnetism detection portion for detecting a magnitude of a magnetic field;
    a temperature detection portion for detecting an ambient temperature; and
    a temperature compensation portion for correcting an error of said magnetism detection portion due to temperature dependency based on the temperature detected by said temperature detection portion;
    wherein a detection signal of said magnetism detection portion, corrected with respect to said error, and a temperature signal detected by said temperature detection portion are outputted via said connector terminals to the exterior.

2. A temperature detection function-incorporating current sensor according to claim 1, further comprising:
   a core, and
   a bus bar;
   wherein said Hall IC is disposed in a gap of said core, and said bus bar passing through a central portion of said core is integrally connected with said current sensor.

3. The temperature detection function-incorporating current sensor according to claim 2, wherein said gap is delimited by a first surface on a first side of said gap and a second surface on a second side of said gap, and wherein said Hall IC is substantially in contact with said first and second surfaces.

4. The temperature detection function-incorporating current sensor according to claim 2, wherein the current sensor, used as a detecting object, is disposed in a vicinity of a device, so that the temperature signal output from the current sensor represents a temperature of the device and is employed for controlling the device.

* * * * *